(12) United States Patent
Kirkpatrick et al.

(10) Patent No.: US 10,450,236 B2
(45) Date of Patent: Oct. 22, 2019

(54) CARBON/CARBON COMPOSITES AND METHODS OF MAKING CARBON/CARBON COMPOSITES HAVING INCREASED FIBER VOLUME AND CERAMIC COMPOUNDS

(71) Applicant: GOODRICH CORPORATION, Charlotte, NC (US)

(72) Inventors: Christopher T. Kirkpatrick, Pueblo West, CO (US); Jean-Francois Le Costaouec, Simsbury, CT (US); John Linck, Pueblo, CO (US)

(73) Assignee: GOODRICH CORPORATION, Charlotte, NC (US)

( * ) Notice: Subject to any disclaimer, the term of this patent is extended or adjusted under 35 U.S.C. 154(b) by 0 days.

(21) Appl. No.: 15/714,006

(22) Filed: Sep. 25, 2017

(65) Prior Publication Data
US 2019/0092698 A1  Mar. 28, 2019

(51) Int. Cl.
*C04B 35/524* (2006.01)
*C04B 35/83* (2006.01)
(Continued)

(52) U.S. Cl.
CPC ............ *C04B 35/83* (2013.01); *C01B 32/382* (2017.08); *C23C 16/045* (2013.01); *F16D 65/126* (2013.01); *F16D 69/023* (2013.01); *C01F 17/0043* (2013.01); *C01G 23/047* (2013.01); *C01G 25/00* (2013.01); *C04B 2235/322* (2013.01); *C04B 2235/3225* (2013.01); *C04B 2235/3232* (2013.01); *C04B 2235/3244* (2013.01); *C04B 2235/3409* (2013.01); *C04B 2235/3804* (2013.01); *C04B 2235/3813* (2013.01); *C04B 2235/3817* (2013.01);
(Continued)

(58) Field of Classification Search
CPC ....... C04B 35/524; C04B 35/83; C04B 35/64; C04B 2235/48
See application file for complete search history.

(56) References Cited

U.S. PATENT DOCUMENTS 5,057,254 A  10/1991  Sohda et al.
5,523,035 A   6/1996  Sohda et al.
(Continued)

FOREIGN PATENT DOCUMENTS

EP          2915794 A1  *  9/2015  ............. C04B 35/83
EP          3112328        1/2017
WO   WO 2007/094969 A2  *  8/2007

OTHER PUBLICATIONS

Bruneton, E., et al., "Carbon-Carbon Composites Prepared by a Rapid Densification Process I: Synthesis and Physico-Chemical Data". Carbon vol. 35, No. 10-11, pp. 1593-1598, 1997.*
(Continued)

*Primary Examiner* — Bret P Chen
(74) *Attorney, Agent, or Firm* — Snell & Wilmer, L.L.P.

(57) ABSTRACT

A method of making a carbon-carbon composite part may comprise fabricating a fibrous preform comprising a fiber volume ratio of 25% or greater, heat treating the fibrous preform at a first temperature, infiltrating the fibrous preform with a first ceramic suspension, densifying the fibrous preform by chemical vapor infiltration (CVI) to form a densified fibrous preform, and heat treating the densified fibrous preform at a second temperature of 1600° C. or greater.

20 Claims, 5 Drawing Sheets

(51) Int. Cl.
*F16D 65/12* (2006.01)
*F16D 69/02* (2006.01)
*C01B 32/354* (2017.01)
*C23C 16/04* (2006.01)
*C01F 17/00* (2006.01)
*C01G 23/047* (2006.01)
*C01G 25/00* (2006.01)

(52) U.S. Cl.
CPC ............ *C04B 2235/3821* (2013.01); *C04B 2235/3839* (2013.01); *C04B 2235/3895* (2013.01); *C04B 2235/421* (2013.01); *C04B 2235/48* (2013.01); *C04B 2235/5436* (2013.01); *C04B 2235/5445* (2013.01); *C04B 2235/614* (2013.01); *C04B 2235/616* (2013.01); *F16D 2200/0047* (2013.01)

(56) References Cited

U.S. PATENT DOCUMENTS

| | | | |
|---|---|---|---|
| 5,776,383 A | 7/1998 | Darrieux | |
| 5,993,905 A * | 11/1999 | Sheehan | F16D 69/023 427/294 |
| 6,221,475 B1 | 4/2001 | Domergue | |
| 7,374,709 B2 | 5/2008 | Bauer | |
| 9,017,761 B2 * | 4/2015 | La Forest | C04B 35/83 427/249.1 |
| 9,353,816 B2 | 5/2016 | La Forest et al. | |
| 2003/0214064 A1 * | 11/2003 | Shin | C04B 35/62847 264/29.7 |
| 2005/0271876 A1 * | 12/2005 | Walker | C04B 35/83 428/408 |
| 2006/0177663 A1 * | 8/2006 | Simpson | C04B 35/6267 428/408 |
| 2006/0279012 A1 * | 12/2006 | Simpson | B29C 70/48 264/29.5 |
| 2007/0186396 A1 | 8/2007 | Linck et al. | |
| 2010/0084075 A1 * | 4/2010 | Rutten | C04B 35/83 156/91 |
| 2010/0291373 A1 | 11/2010 | Baud et al. | |
| 2011/0111123 A1 * | 5/2011 | La Forest | C04B 35/83 427/249.2 |
| 2015/0376064 A1 * | 12/2015 | Chung | C04B 33/326 501/100 |
| 2016/0123416 A1 * | 5/2016 | Perea | F16D 65/126 188/218 XL |
| 2016/0332917 A1 * | 11/2016 | Hipp | B29B 11/16 |
| 2016/0376203 A1 * | 12/2016 | Rudolph | C04B 41/5001 428/408 |

OTHER PUBLICATIONS

Li, He-Jun, et al., "Densification of unidirectional carbon-carbon composites by isothermal chemical vapor infiltration". Carbon 38 (2000) 423-427.*

Devi, G. Rohini, et al., "Carbon-Carbon Composites—An Overview". Defence Science Journal, vol. 43, No. 4, Oct. 1993, pp. 369-383.*

Windhorst, Torsten, et al., "Carbon-Carbon Composites: a summary of recent developments and applications". Materials & Design, vol. 18, Issue 1, Feb. 1997, pp. 11-15.*

Ohzawa, Y., et al., "Preparation of gas-permeable SiC shape by pressure-pulsed chemical vapour infiltration into carbonized cotton-cloth preforms". Journal of Materials Science 33 (1998) 1211-1216.*

Michaud, Veronique, "Fibrous Preforms and Preforming". Wiley Encyclopedia of Composites, Second Edition, Edited by Luigi Nicolais and Assunta Borzacchiello. 2012, pp. 1-13.*

European Patent Office, European Search Report dated Jan. 23, 2019 in Application No. 18196465.1.

Corral E L et al: "Improved ablation resistance of C—C composites using zirconium diboride and boron carbide", Journal of the European Ceramic Society, Elsevier Science Publishers, Barking, Essex, GB, vol. 30, No. 11, Aug. 1, 2010 (Aug. 1, 2010), pp. 2357-2364.

* cited by examiner

CARBON/CARBON COMPOSITES AND METHODS OF MAKING CARBON/CARBON COMPOSITES HAVING INCREASED FIBER VOLUME AND CERAMIC COMPOUNDS

FIELD

The present disclosure relates to carbon/carbon composites, and more specifically, to carbon/carbon composites having increased fiber volume and ceramic compounds.

BACKGROUND

Aircraft brake systems typically employ a series of brake disks that, when forced into contact with each other, help to stop the aircraft. The brake disks may comprise a carbon fiber-reinforced/carbon matrix (C/C) composite material. For example, in a brake system, the rotor friction disks, stator friction disks, pressure plates, and/or end plates may be comprised of C/C composite materials. Rotor friction disks and stator friction disks comprised of C/C composite materials may exhibit varying wear characteristics, friction coefficients, and vibration profiles resulting in part from the materials used to construct the C/C composite materials and the heat treatments to which the C/C composite materials are exposed.

SUMMARY

A method of making a carbon-carbon composite part is disclosed, in accordance with various embodiments. The method may comprise fabricating a fibrous preform comprising a fiber volume ratio of 25% or greater, heat treating the fibrous preform at a first temperature, infiltrating the fibrous preform with a first ceramic suspension, densifying the fibrous preform by chemical vapor infiltration (CVI), and heat treating the densified fibrous preform at a second temperature of 1600° C. or greater.

In various embodiments, fabricating the fibrous preform may comprise disposing a weight over the fibrous preform during a carbonization of the fibrous preform to increase the fiber volume ratio of the fibrous preform during the carbonization. In various embodiments, the method may further comprise partially densifying the fibrous preform prior to infiltrating the fibrous preform with the first ceramic suspension to form a partially densified fibrous preform. The method may further comprise heat treating the partially densified fibrous preform at a third temperature of 1850° C. or greater prior to infiltrating the fibrous preform with the first ceramic suspension. The method may further comprise infiltrating the fibrous preform with a second ceramic suspension prior to partially densifying the fibrous preform.

In various embodiments, the method may further comprise preparing the first ceramic suspension using at least one of a boron-oxide source or an oxide source and a boron source. The oxide source may comprise at least one of zirconia, yttria stabilized zirconia, $TiO_2$, or $Y_2O_3$. The boron source may comprise at least one of a boron powder, boron carbide powder, boron oxide powder, or boric acid, the boron powder comprising a size less than 2 micrometers. At least one of the heat treating the fibrous preform at the first temperature or the heat treating the fibrous preform at the second temperature may form borides in the carbon-carbon composite part. The method may further comprise adding a carbon source to the first ceramic suspension. The carbon source may comprise at least one of polyvinyl alcohol, polyacrylamide, hydro ethylcellulose, or an aqueous emulsion of polyester, epoxy, or phenolic.

In various embodiments, the method may further comprise preparing the first ceramic suspension using yttrium oxides and zirconium oxides. At least one of the heat treating the fibrous preform at the first temperature or the heat treating the fibrous preform at the second temperature may form at least one of zirconium oxycarbide or zirconium carbide and at least one of yttrium oxycarbide or yttrium carbide in the carbon-carbon composite part.

In various embodiments, the carbon-carbon composite part may comprise a brake disk.

A method of making a carbon-carbon composite is disclosed, in accordance with various embodiments. The method may comprise heat treating a fibrous preform at a first temperature. The fibrous preform may comprise a fiber volume ratio of 25% or greater. The method may further comprise performing a first densification of the fibrous preform using CVI, infiltrating the fibrous preform with a first ceramic suspension, performing a second densification of the fibrous preform using CVI, and heat treating the fibrous preform at a second temperature of 1600° C. or greater.

In various embodiments, the method may further comprise heat treating the fibrous preform at a third temperature of 1850° C. or greater prior to infiltrating the fibrous preform with the first ceramic suspension. In various embodiments, the first temperature may be greater than 2200° C. In various embodiments, the second temperature may be between 1850° C. and 2100° C. and the first temperature may be between 2350° C. and 2450° C.

In various embodiments, the method may further comprise preparing the first ceramic suspension using at least one of a boron-oxide source or an oxide source and a boron source. The oxide source may comprise at least one of zirconia, yttria stabilized zirconia, $TiO_2$, or $Y_2O_3$. The boron source may comprise at least one of a boron powder, boron carbide powder, boron oxide powder, or boric acid, the boron powder comprising a size less than 2 micrometers. At least one of the heat treating the fibrous preform at the first temperature or the heat treating the fibrous preform at the second temperature may form borides in the carbon-carbon composite part.

In various embodiments, the method may further comprise preparing the first ceramic suspension using yttrium oxides and zirconium oxides. At least one of the heat treating the fibrous preform at the first temperature or the heat treating the fibrous preform at the second temperature may form at least one of zirconium oxycarbide or zirconium carbide and at least one of yttrium oxycarbide or yttrium carbide in the carbon-carbon composite part.

In various embodiments, the fiber volume ratio of the fibrous preform may be between 25% and 40%. In various embodiments, the method may further comprise infiltrating the fibrous preform with a second ceramic suspension prior to performing the first densification of the fibrous preform.

A method of making a carbon-carbon composite brake disk is disclosed, in accordance with various embodiments. The method may comprise heat treating a fibrous preform at a first temperature. The fibrous preform may comprise a fiber volume ratio of 25% or greater. The method may further comprise infiltrating the fibrous preform with a ceramic suspension, performing a first densification of the fibrous preform using CVI, and heat treating the fibrous preform at a second temperature of 1600° C. or greater.

In various embodiments, the method may further comprise performing a second densification of the fibrous preform prior to infiltrating the fibrous preform with the ceramic suspension. The method may further comprise heat treating the fibrous preform at a third temperature of 1850° C. or greater prior to infiltrating the fibrous preform with the ceramic suspension.

The forgoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE D WINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the disclosure, it should be understood that other embodiments may be realized and that logical changes and adaptations in design and construction may be made in accordance with this disclosure and the teachings herein without departing from the spirit and scope of the disclosure. Thus, the detailed description herein is presented for purposes of illustration only and not of limitation.

Provided herein, according to various embodiments, is a manufacturing system(s) and associated method(s) for fabricating ceramic matrix composite components while mitigating the formation and accumulation of harmful/hazardous byproduct deposits. While numerous details are included herein pertaining to aircraft components, such as brake components, the manufacturing system(s) and method(s) disclosed herein can be applied to fabricate other ceramic matrix composite components.

Figure 1:
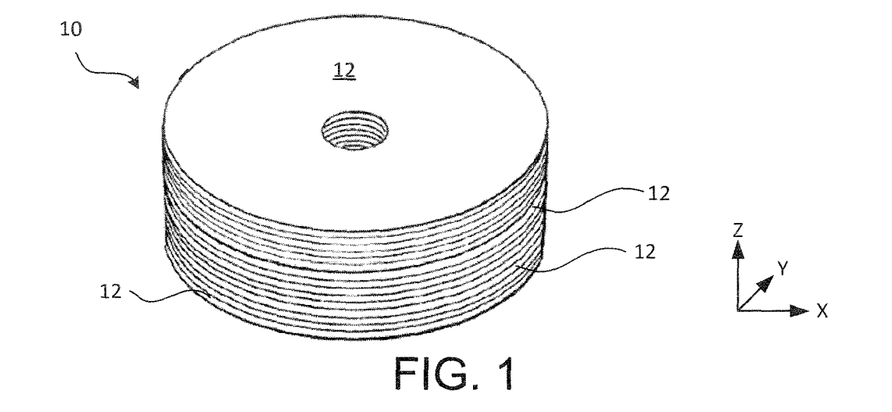
FIG. 1 illustrates a fibrous preform, in accordance with various embodiments.

Referring now to FIG. 1, a fibrous preform 10 is illustrated, in accordance with various embodiments. Fibrous preform 10 may comprise a porous structure comprised of a plurality of stacked textile layers 12. A porous structure may comprise any structure derived from a fibrous material such as carbon fibers or the like. In various embodiments, the carbon fibers may be derived from polyacrylonitrile (PAN), rayon (synthetic fiber derived from cellulose), oxidized polyacrylonitrile fiber (OPF), pitch, or the like. The starting fiber may be pre-oxidized PAN or fully carbonized commercial carbon fiber. Fibrous preform 10 may be prepared by needling the textile layers 12 of fibrous preform 10. Needling the textile layers 12 of fibrous preform 10 tends to push fibers from one layer 12 to the next layer 12, thereby forming z-fibers that extend perpendicularly across the layers 12. Needling pulls fibers from the in-plane direction and forces them into the z-fiber direction. After needling, fibrous preform 10 may comprise fibers extending in three different directions (i.e., in the x and y directions and the z direction).

Fibrous preform 10 may be fabricated using a net shape preforming technology or may be cut from a needled board. Alternatively, preforms may be a 2D lay-up of woven, braided or knitted fabric. The fibrous material may be in the form of chopped carbon fibers molded to form a preform. Prior to the densification process, the fibrous material may be formed into a preform having any desired shape or form. For example, the fibrous preform may be in the form of a disk having any shape such as, for example, a polygon, a cylinder, a triangle, annular, square, rectangle, pentagon, hexagon, octagon, or the like. In addition, the fibrous preform may have an irregular form.

Figure 2:
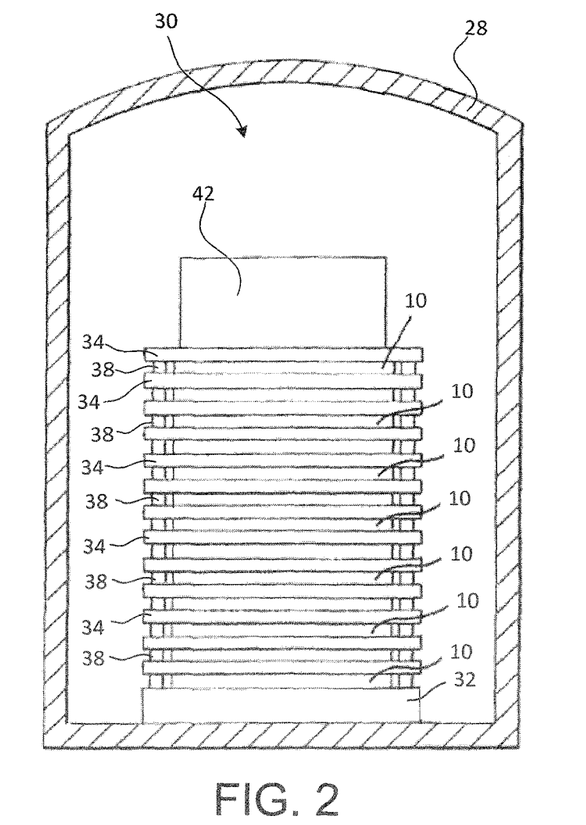
FIG. 2 illustrates a fibrous preform in a carbonization furnace, in accordance with various embodiments.

As shown in FIG. 2, fibrous preforms 10 may be placed in a furnace 28 for carbonization. The carbonization process may be employed to convert the fibers of the fibrous preforms 10 into pure carbon fibers, as used herein only "pure carbon fibers" means carbon fibers comprised of at least 99% carbon. The carbonization process is distinguished from the densification process described below in that the densification process involves infiltrating the pores of the fibrous preform 10 and depositing a carbon matrix within and around the carbon fibers of the fibrous preform, and the carbonization process refer to the process of converting the fibers of the fibrous preform 10 into pure carbon fibers.

In various embodiments, a plurality of fibrous preforms 10 may be placed on top of one another with separator plates 34 and spacing stops 38 disposed between adjacent fibrous preforms 10. For example, the bottommost fibrous preform 10 may be placed on a base plate 32 at the bottom of carbonization furnace 28. A separator plate 34 may be placed on top of the bottommost fibrous preform 10. Another fibrous preform 10 may then be placed on the separator plate 34, and another separator plate 34 may be placed on that fibrous preform 10. A stack of fibrous preforms 10 and separator plates 34 may be constructed in this manner, with each fibrous preform 10 being separated from superjacent and subjacent fibrous preforms 10 by separator plates 34. Stops 38 may be placed between each of the separator plates 34. The stops 38 may comprise a height that is less than the thickness of the fibrous preform 10 prior to carbonization. Stops 38 may define a target thickness of the fibrous preform 10 after carbonization. In that regard, after the stack of fibrous preforms 10 is constructed, and before the carbonization process has started, gaps may exist between the stops 38 and adjacent separator plates 34. During carbonization, a compressive load may be applied to the fibrous preforms 10, thereby compressing fibrous preforms 10 until stops 38 contact adjacent separator plates 34.

Compressive pressure may be applied to fibrous preforms 10 during the carbonization process to increase the fiber volume of carbonized fibrous preforms 10. The compressive pressure may be applied by placing a weight 42 over fibrous preforms 10, or by applying a compressive load to the fibrous preform by other suitable means. The compressive pressure may be applied along the direction of the z-fibers. In various embodiments, weight 42 may be at least 150 lbs (68.0 kg) and may generate a compressive force of 0.50 psi (0.034 bar). It will be appreciated by those skilled in the art that the mass of weight 42 and/or the compressive force generated by weight 42 may vary depending on the size of fibrous preforms 10, the pre-carbonization fiber volume of fibrous preforms 10, the desired post-carbonization fiber volume of fibrous preforms 10, and/or the number fibrous preforms 10 being compressed. Applying compressive pressure to fibrous preforms 10 during the carbonization process tends to increase the after-carbonization fiber volume ratio of fibrous preforms 10. As used herein, "fiber volume ratio" means the ratio of the volume of the fibers of the fibrous preform to the total volume of the fibrous preform. For example, a fiber volume ratio of 25% means the volume of the fibers in the fibrous preform is 25% of the total volume of fibrous preform. In various embodiments, after carbonization, fibrous preform 10 comprises a fiber volume of 25% or greater. In various embodiments, after carbonization, fibrous preform 10 comprises a fiber volume of between 23% and 50%. In various embodiments, after carbonization, fibrous preform 10 comprises a fiber volume of between 25% and 40%.

After carbonization, fibrous preforms 10, may be densified using CVI, as described in further detail below. In various embodiments, prior to densification, fibrous preform 10 may undergo a first heat treatment. The first heat treatment may comprise treating fibrous preform 10 with heat at a temperature of 2200° C. (3992° F.) or greater for between 1 hour and 20 hours. In various embodiments, the first heat treatment may comprise treating fibrous preform 10 with heat at a first temperature of between 2200° C. and 2600° C. (i.e., between 3992° F. and 4712° F.) for between 4 and 20 hours. In various embodiments, the first heat treatment may comprise treating fibrous preform 10 with heat at a first temperature of between 2350° C. and 2450° C. (i.e., between 4262° F. and 4442° F.) for between 4 and 20 hours. The duration of the first heat treatment may vary depending on the size of fibrous preforms 10, the fiber volume ratio of fibrous preforms 10, and/or the number fibrous preforms 10 being heat treated.

Figure 3:
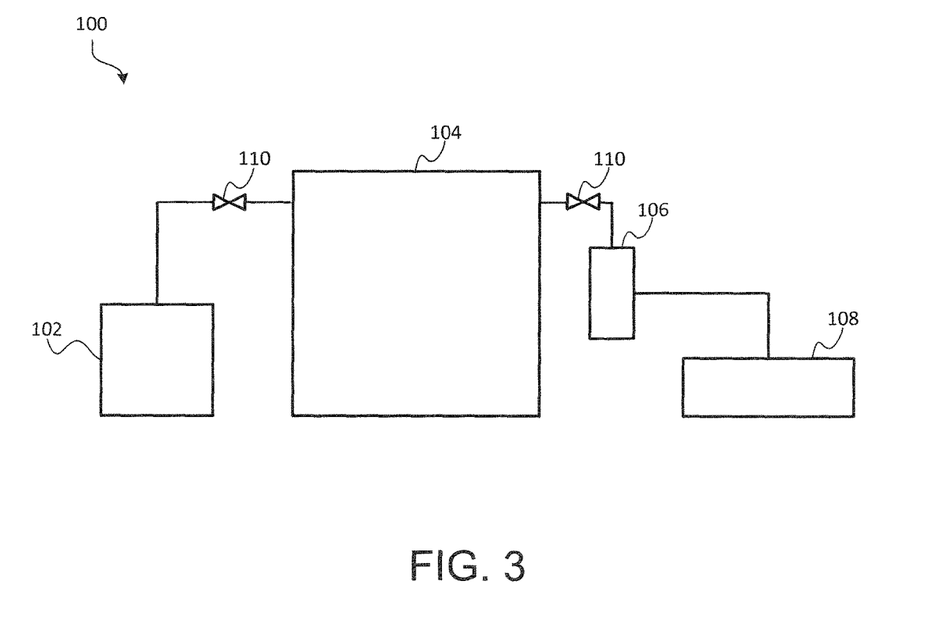
FIG. 3 illustrates an exemplary colloidal ceramic suspension infiltration system, in accordance with various embodiments.

In various embodiments, after the first heat treatment, the fibrous preforms 10 may be infiltrated with a ceramic preparation. As used herein, ceramic preparation describes a ceramic suspension, which may be a colloidal suspension, and/or a ceramic sol gel for infiltration into a carbon structure. With reference to FIG. 3, an exemplary colloidal ceramic suspension infiltration system 100 is shown, in accordance with various embodiments. System 100 may include a fluid reservoir 102 for storing and delivering the ceramic suspension into the vacuum chamber 104. Vacuum chamber 104 is equipped with a tank in which the fibrous preforms may be located. Vacuum pump 108 and trap 106 are used to first evacuate the porosity of the fibrous preforms and subsequently facilitate drawing the ceramic suspension into the tank containing the parts to be infiltrated (e.g., fibrous preforms 10). In various embodiments, following infiltration, the fibrous preforms are removed and dried in a separate oven.

In various embodiments, fibrous preform 10 may undergo a second heat treatment partially through the densification process. For example, fibrous preform 10 may be partially densified and then heat treated before a final densification. The second heat treatment may comprise treating fibrous preform 10 with heat at a temperature of 1850° C. (3362° F.) or greater for between 4 hours and 20 hours. In various embodiments, the second heat treatment may comprise treating fibrous preform 10 with heat at a temperature of between 2000° C. and 2200° C. (i.e., between 3632° F. and 3992° F.) for between 4 and 20 hours. In various embodiments, the second heat treatment may comprise treating fibrous preform 10 with heat at a temperature of between 2050° C. and 2150° C. (i.e., between 3722° F. and 3902° F.) for between 4 and 20 hours. The duration of the second heat treatment may vary depending on the size of fibrous preforms 10, the fiber volume ratio of fibrous preforms 10, and/or the number fibrous preforms 10 being heat treated.

In various embodiments, fibrous preform 10 may undergo a final heat treatment after the densification process. The third heat treatment may comprise treating densified fibrous preform 10 (i.e., fibrous preform comprising both carbon fiber and carbon matrix) with heat at a temperature of 1600° C. (2912° F.) or greater for between 4 hours and 20 hours. In various embodiments, the final heat treatment may comprise treating densified fibrous preform 10 with heat at a temperature of between 1850° C. and 2200° C. (i.e., between 3362° F. and 3992° F.) for between 4 and 20 hours. The duration of the final heat treatment may vary depending on the size of densified fibrous preforms 10, the fiber volume ratio of fibrous preforms 10, and/or the number fibrous preforms 10 being heat treated.

Figure 4:
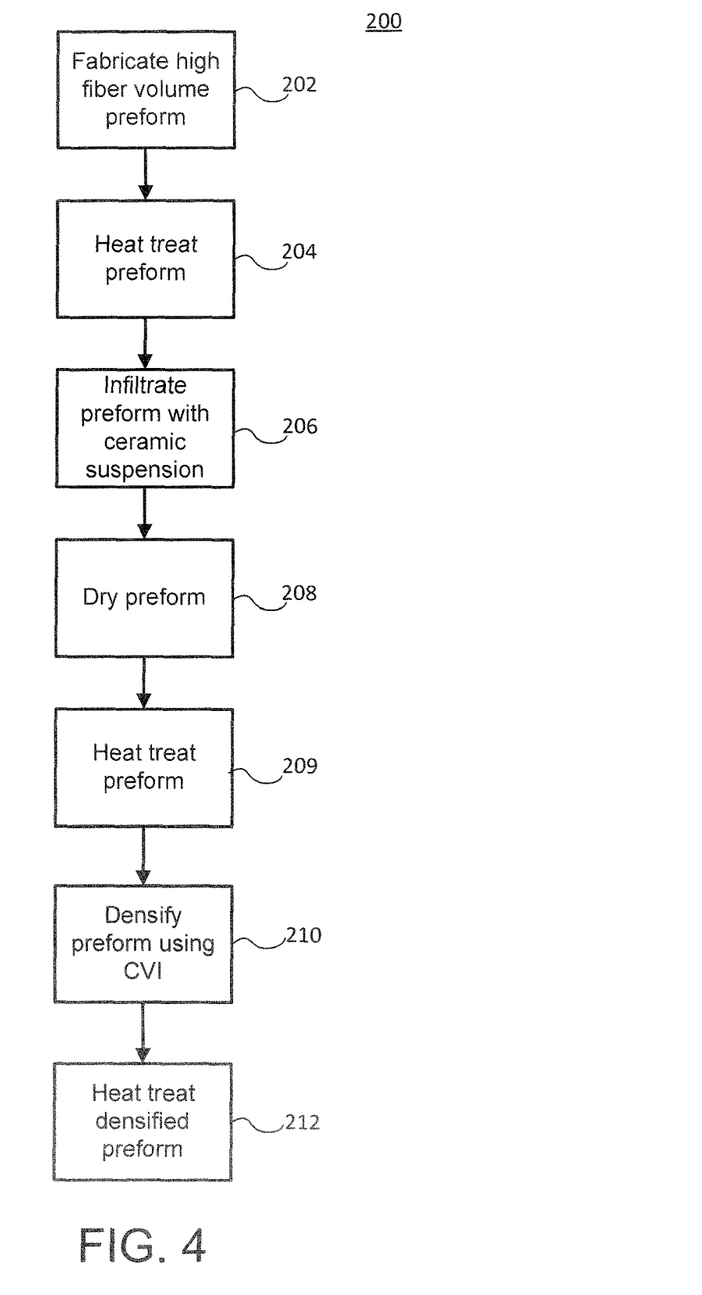
FIG. 4 illustrates a method of forming a C/C composite with a single application of ceramic suspension followed by CVI densification, in accordance with various embodiments.

With reference to FIG. 4, a method 200 for making a C/C composite is shown, in accordance with various embodiments. Method 200 may comprise fabricating a fibrous preform comprising a fiber volume ratio of 25% or greater (Step 202). In various embodiments, fabricating the fibrous preform may comprise disposing a weight over the fibrous preform during carbonization of the fibrous preform. In various embodiments, the fibrous preform may be heat treated at a first temperature of 2200° C. (3992° F.) or greater (Step 204).

Method 200 may further comprise infiltrating the fibrous preform with a ceramic suspension (Step 206). In various embodiments, the preform may be infiltrated with a ceramic suspension that is at least one of a ceramic colloidal suspension or sol gel solution prepared with a selected ceramic content of yttrium compounds and zirconium compounds, for example, with a selected content of yttrium oxide and zirconium oxide. In various embodiments, the yttrium compounds and zirconium compounds may be combined at the particle level, for example, in particles comprising yttria-stabilized zirconia. For example, an aqueous colloidal suspension comprising yttria-stabilized zirconium compounds, such as $Y_2O_3$—$ZrO_2$, may be introduced in the fibrous preform. The starting ceramic powders may comprise ceramic particles of yttria-stabilized zirconia having various sizes, for example, sizes ranging from 40 nanometers to 60 nanometers ($1.57\ e^{-6}$ inches to $2.36\ e^{-6}$ inches), or from 10 nanometers to 13 nanometers ($3.9\ e^{-7}$ inches to $5.1\ e^{-7}$ inches).

In various embodiments, the incorporation of a controlled starting amount of very fine ceramic particles throughout the fibrous preform or throughout a partially densified fibrous preform (also referred to herein as a partially densified carbon structure) may lead to the formation of very fine carbides of yttrium and carbides of zirconium compounds following subsequent heat treatments and further carbon densification cycles. In various embodiments, the carbides of yttrium and carbides of zirconium compounds may comprise sizes below 500 nanometers ($2.0\ e^{-5}$ inches). Additives such as a wetting agent may be made to the ceramic suspension to facilitate wetting of the preform or of the partially densified carbon structure (i.e., the partially densified fibrous preform). During subsequent heat treatments of the fibrous preform under an inert atmosphere at temperatures greater than 1100° C. (2012° F.), carbo-thermal reduction of yttrium oxides and zirconium oxides may occur, yielding zirconium oxycarbide, zirconium carbide, yttrium oxycarbide, and/or yttrium carbide compounds. In various embodiments, residual yttrium oxides and zirconium oxides, which may be combined as yttria-stabilized zirconia, may remain after the heat treatments.

In various embodiments, it may be advantageous to provide an additional source of carbon to the colloidal ceramic suspension or sol gel solution to control the grain size of the particles comprising zirconium oxides and/or yttrium oxides, during the carbo-thermal reduction of the yttrium oxides and zirconium oxides. This may be accomplished by adding a carbon compound to the starting suspension in the form of one or several water soluble polymers such as a polyvinyl alcohol (PVA), polyvinylpyrrolidone (PVP), polyvinyl acetate, poly (2-oxazoline), polyacrylamide (PAM), polyethyleneimine (PEI), and/or polyacrylate (PAA). An aqueous emulsion of polyester, epoxy, or phenolic may be also used. Aqueous carbon black dispersions may be used as the additional carbon source, or to supplement a water-soluble polymer. These carbon sources exhibit various char yields and may be introduced in the form of one or more components. Prior to adding the additional carbon compound to the ceramic suspension, the pH of the ceramic suspension may be adjusted. For example, the pH of the ceramic suspension may be made more basic by adding ammonium hydroxide or other similar Arrhenius base.

In various embodiments, effectiveness of the carbon addition may be improved by pursuing individual carbon coatings of the ceramic particles comprising yttrium oxides and/or zirconium oxides. Encapsulation of the ceramic particles with a thin polymeric layer of carbon during the preparation of the ceramic suspension may be accomplished by the addition of a polyelectrolyte dispersant or organic acid, such as citric acid, trans-aconitic acid, or cis-aconitic acid, into the ceramic suspension, which absorbs and coats the ceramic particles. The type and amount of polyelectrolyte may be chosen to provide a sufficient carbon char yield upon heat treatment in an inert atmosphere. In various embodiments, dispersants include ammonium polyacrylates, polyethyleneimine, and/or polyacrylamide. In response to subsequent processing, the absorbed layer of polymer may be pyrolyzed into a carbon film.

In various embodiments, the addition of an aqueous carbon black dispersion and/or additional water soluble polymer to the colloidal ceramic suspension may take place to achieve a greater amount of carbon. The addition of an aqueous carbon black dispersion and/or additional water soluble polymer to the colloidal ceramic suspension may take place following the formation of an adsorbed polymer layer on the ceramic particles from the polyelectrolyte dispersant or organic acid, or the carbon black dispersion and/or the water soluble polymer may be the only source of carbon in the ceramic suspension.

In various embodiments, the aqueous ceramic suspension may be prepared from dry ceramic powder, comprising yttria-stabilized zirconia, and/or already suspended yttria-stabilized zirconia particles. Ceramic colloidal suspensions comprising yttrium oxides and zirconium oxides may be prepared using various materials. For example, a dry ceramic powder comprising 10% by weight of yttria-stabilized zirconia ($Y_2O_3$—$ZrO_2$, with 16% $Y_2O_3$ by weight) may be added to distilled water comprising 0.2% ammonium polyacrylate polyelectrolyte. The ceramic powder may be made of nanosize particles, which may be available in agglomerated granules to limit the health hazard associated with the handling of nanosize powder. The ceramic granules comprised in the ceramic powder may be dispersed using a high energy mixer, such as an attrition mill of a high shear mixer, in order to de-agglomerate the ceramic granules to their elementary nanosize original states. The pH of the solution may be increased to at or between 10 and 11 by adding ammonium hydroxide. Non-ionic aqueous nano carbon black, having a pH at or between 9 and 11, may be added and mixed into the ceramic suspension. The amount of added carbon black may correspond to a ratio of carbon/yttria-stabilized zirconia of 0.29, or 2.8% of the total ceramic suspension. The ceramic suspension may further be de-agglomerated using ultrasounds.

In various embodiments, the ceramic suspension, which may be an aqueous ceramic suspension, or slurry, may infiltrate the porosity of the carbon preform, the porosity of a partially densified carbon structure, and/or other carbon structure. The porosity of a carbon structure refers to the pores, or spaces, between the carbon fibrous network. The infiltration may be conducted by immersing the carbon preform or partially densified carbon structure in the aqueous ceramic suspension. In various embodiments, infiltration may be conducted following evacuation of the pores of the carbon structure using a vacuum chamber.

Following drying of the ceramic suspension incorporated within the fibrous preform or partially densified carbon structure, the carbon structure (i.e., the fibrous preform or partially densified carbon structure) may be heat treated to a suitable temperature in an inert environment so as to transform the added polymer or other carbon source, such as carbon black, into amorphous carbon. This step may be conducted in a separate furnace or during the ramp up to the temperature of a CVI pyrolytic carbon densification cycle. Following each addition of pyrolytic carbon to the carbon structure, the carbon structure may be heat treated in inert atmosphere to fully or partially complete the thermo-reduction of the yttrium oxides to yttrium oxycarbides and/or yttrium carbides, and the zirconium oxides to zirconium oxycarbides and/or zirconium carbides by the additional source of carbon in the form of pyrolyzed polymers and/or carbon black.

In various embodiments, step 206 may comprise infiltrating the preform with a ceramic suspension that is one of a ceramic colloidal suspension or sol gel solution prepared with a selected ceramic content of very fine oxides and boron or very fine oxide-boron compounds. For example, an aqueous colloidal suspension comprising oxides and boron or oxide-boron compounds may be introduced in the fibrous preform. The starting colloidal oxides may be nanosize suspensions. The boron compound may be less than 2 micron (0.00019 inches) and may be submicron size.

The uniform incorporation of a controlled amount of starting ultra-fine ceramic particles of oxides and boron or oxide-boron compounds throughout the fibrous preform may lead to the formation of ultra-fine boride particles (e.g., zirconium diboride, titanium diboride, and/or yttrium diboride) following subsequent heat treatments. The borides may be a single boride, mixed borides, or a combined boride. This may be accomplished by the preparation and introduction of a suspension containing either a single oxide like $ZrO_2$ or $TiO_2$ and a boron source; or mixed oxides like $ZrO_2$ and $TiO_2$ and a boron source; or a combined oxide like $ZrO_2/Y_2O_3$ and a boron source. Additives such as a wetting agent may be made to the suspension to facilitate wetting of the preform. During subsequent heat treatments of the preform or partially densified carbon structure under inert atmosphere at a temperature greater than 1100° C. (2012° F.), a boride or mixed borides may be formed through borothermal reduction of the oxide or oxides. In various embodiments, a heat treatment (Step 209) at a temperature of 1200° C. or greater (2192° F. or greater) may be performed prior to starting the CVI pyrolytic carbon densification cycle (Step 210) to allow at least part of the transformation of the oxides and boron or the oxide-boron compounds to the corresponding borides to take place prior to the CVI densification cycle. Preforming a heat treatment prior to the CVI densification cycle tends to avoid gaseous boron products, which start evolving around 1000° C. (1832° F.), from interfering with the CVI densification process. In various embodiments, the heat treatment of Step 204 may be performed after drying the preform (Step 208) and may replace Step 209. Following each addition of pyrolytic carbon to the preform, the partially densified carbon structure may be further heat treated to fully or partially complete the borothermal reaction.

In various embodiments, an additional source of carbon may be provided to the colloidal ceramic suspension or sol gel solution to control the grain size of the boride during the borothermal reaction. For example, one or several water soluble polymers such as PVA, PVP, polyvinyl acetate, poly (2-oxazoline), PAM, hydro ethylcellulose, PEI, or PAA may be added to the ceramic suspension. An aqueous emulsion of polyester, epoxy or phenolic may be also used. Prior to adding the additional carbon compound, the PH of the ceramic suspension may be adjusted. For example, in the case of PVA or hydro ethylcellulose addition, the PH of the ceramic suspension may be made basic.

In various embodiments, the aqueous ceramic suspension may be prepared from dry or already suspended nano oxides and micron-sized boron compounds. For example, a micron size boron compound in powder or liquid form may be added to commercial aqueous nano suspensions of the selected oxide or oxides. A water soluble carbon source may be added to the ceramic suspension. A wetting agent may be added to facilitate wetting of the preform and or partially densified carbon structure. In various embodiments, oxide sources may include nano suspensions of zirconia, yttria stabilized zirconia, $TiO_7$, and/or $Y_2O_3$. In various embodiments, oxide sources may further include sol gel from one or several alkoxides such as zirconyl nitrate, zirconium butoxide, titanium isopropoxide, titanium butoxide, yttrium nitrate. Additionally, a Ti or Zr source may be a chelate such as aqueous titanium lactate, aqueous zirconyl chloride compound.

In various embodiments, possible boron sources may include boron, boron carbide powder, boron oxide powder, and/or boric acid. The aqueous ceramic suspension may be infiltrated either within the porosity of the preform or within the porosity of the partially densified carbon structure. The infiltration may be conducted by immersing the preform or partially densified carbon structure in the aqueous ceramic suspension. Infiltration may also be conducted following evacuation of the pores using a vacuum chamber. Following introduction of the slurry within the part, the part may be dried to remove water. The targeted amount of dry ceramic compound may range from 0.5% to 12% by weight of the finished C/C composite. The ceramic content of the aqueous ceramic suspension may be selected to leave ceramic compounds in the targeted range. The range may provide wear improvement benefit without negatively impacting the mechanical properties of the C/C composite.

Examples of starting material combinations to form various borides may include, for example, a preparation of zirconium diboride from $ZrO_2$ and boron. The borothermal reaction may proceed as:

$$ZrO_2 + 4B \rightarrow ZrB_2 + 2BO(g) \quad (1)$$

In various embodiments, an example preparation of zirconium diboride from ZrO2, boron carbide, and carbon may proceed as:

$$2ZrO_2 + B_4C + 3C \rightarrow 2ZrB_2 + 4CO(g) \quad (2)$$

In various embodiments, an example preparation of titanium diboride from TiO2, boron carbide, and carbon may proceed as $$2TiO_2 + B_4C + 3C \rightarrow 2TiB_2 + 4CO(g) \quad (3)$$

In various embodiments, an exemplary preparation of zirconium yttrium diboride may result from combined $Y_2O_3$ stabilized zirconia, boron carbide, and carbon. In various embodiments, an example preparation of mixed zirconium titanium diboride from mixed zirconia and titania, boron carbide, and carbon may be used. Following drying of the ceramic suspension incorporated within the carbon structure, the preform or partially densified carbon structure may be heat treated to a suitable temperature in an inert environment so as to transform the added polymer into amorphous carbon. This step may be conducted in a separate furnace or during the ramp up to temperature of a CVI pyrolytic carbon densification cycle. Following each addition of pyrolytic carbon to the carbon structure, the preform may be heat treated to complete the borothermal reaction.

Figure 5:
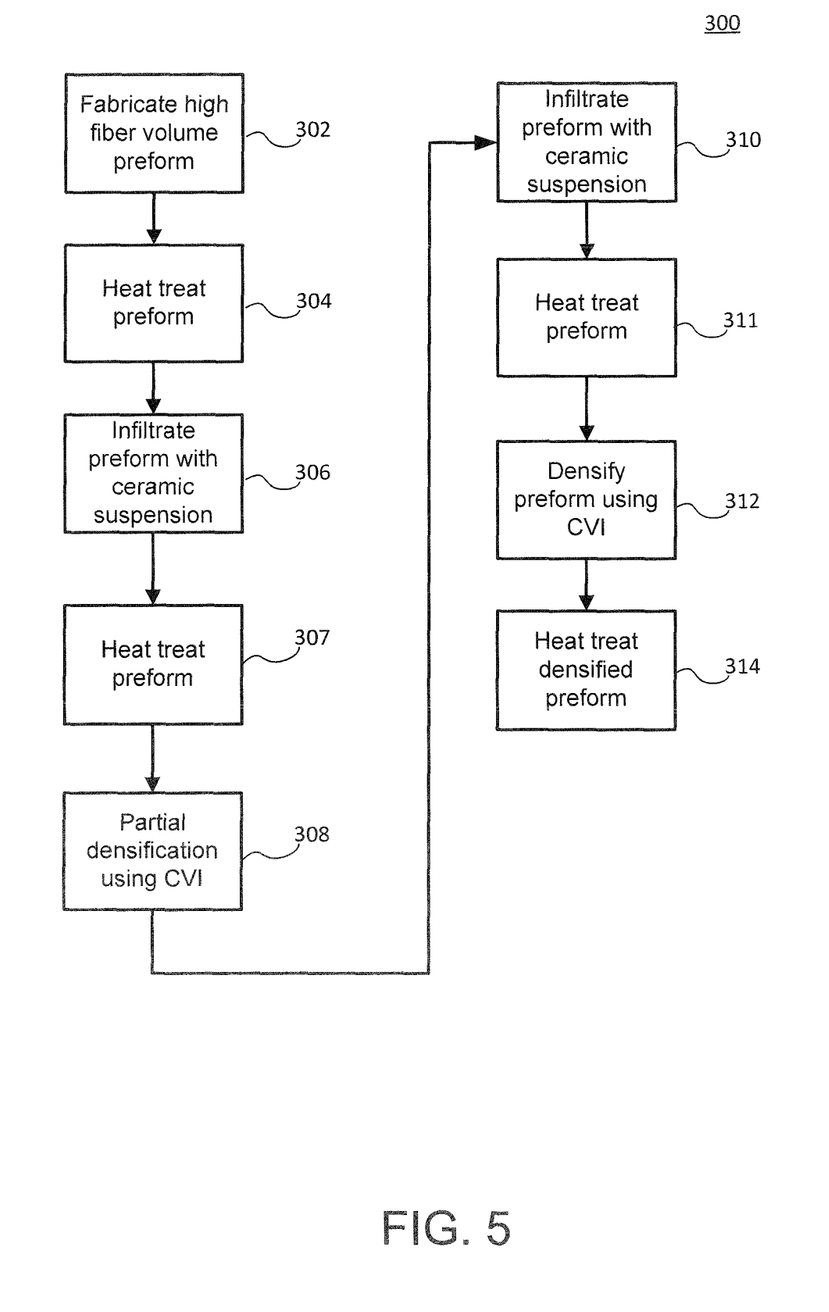
FIG. 5 illustrates a method of forming a C/C composite by applying ceramic suspension at multiple times, in accordance with various embodiments.
Figure 6:
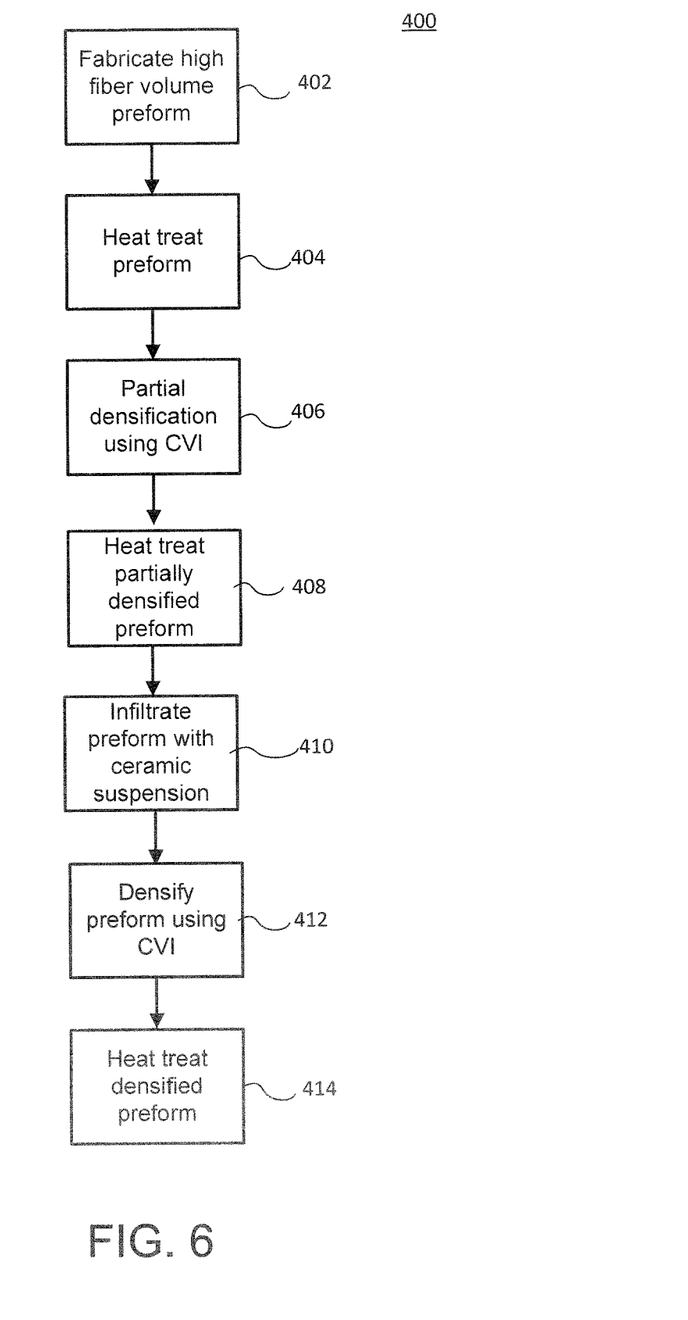
FIG. 6 illustrates a method of forming carbon components with an application of ceramic suspension following a partial CVI densification, in accordance with various embodiments.

In various embodiments, the ceramic suspension containing at least one of yttrium oxide and zirconium oxide compounds, oxides and boron compounds, or oxide-boron compounds may infiltrate the carbon structure at one stage of the C/C composite fabrication, for example, at the preform level, as shown in Step 206 of FIG. 4, or after a partial pyrolytic carbon densification, as shown in Step 310 of FIG. 5 and Step 410 of FIG. 6. In various embodiments, the ceramic particles may infiltrate fibrous preform at several stages of the C/C composite fabrication as illustrated in Steps 306 and 310 of FIG. 5. For example, the ceramic particles may be partially introduced into the preform before and after partial CVI pyrolytic densification.

Returning to FIG. 4, after infiltration by the ceramic suspension, the preform may be dried (Step 208). The preform may further be densified using one or multiple CVI cycles (Step 210). In various embodiments, a heat treatment (Step 209) may be performed prior to starting the first CVI cycle (Step 210). Each CVI cycle may be followed by a heat treatment with a final heat treatment (Step 212) following the final CVI cycle. In various embodiments, the heat treatment of Step 212 may comprise treating the densified fibrous preform with heat at a temperature of 1600° C. or greater (2912° F. or greater). In various embodiments, the heat treatment of Step 212 may comprise treating the densified fibrous preform with heat at a temperature of between 1850° C. and 2200° C. (i.e., between 3362° F. and 3992° F.).

With reference to FIG. 5, a method 300 for treating a preform and/or partially densified carbon structure is shown, in accordance with various embodiments. Method 300 is similar to method 200 of FIG. 4 in that method 300 may begin by fabricating a preform (Step 302) and heat treating the preform (Step 304). Method 300 may also end with densifying the preform using CVI and heat treating the densified carbon structure following the CVI cycle (Step 312 and Step 314) in a manner similar to that of method 200 of FIG. 4. The steps of infiltrating the preform with a ceramic suspension (Step 306 and Step 310) may also be similar to the infiltration of Step 206 of FIG. 4, but applied at different times, and Steps 306 and 310 may each be followed by a drying step similar to Step 208 of FIG. 4. The first infiltration step (Step 306) may be applied after the fiber preform is fabricated and heat treated but before a partial CVI densification (Step 308), which may include a heat treatment step. The second infiltration step (Step 310) may be applied after partial densification using CVI (Step 308). After the second infiltration step (Step 310), the partially densified carbon structure may be dried, and then densified using CVI (Step 312) and heat treated (Step 314). Thus, ceramic suspension infiltration may be applied on two or more separate occasions in method 300.

In various embodiments, a heat treatment (Step 307), similar to Step 209 of FIG. 4, may be performed prior to the partial CVI densification (i.e., prior to Step 308) to begin the ceramic transformation reaction (e.g., the carbo-thermal reduction of the yttrium oxides and zirconium oxides or the borothermal reaction) prior to densification. In various embodiments, the heat treatment of Step 304 may be performed after infiltrating the preform with the ceramic suspension (i.e., after Step 306) and may replace Step 307. In various embodiments, a heat treatment (Step 311), similar to Step 209 of FIG. 4, may be performed prior to the CVI densification (i.e., prior to Step 312) to begin the ceramic transformation reaction (e.g., the carbo-thermal reduction of the yttrium oxides and zirconium oxides or the borothermal reaction). Additional partial CVI and/or heat treatment steps may separate the various ceramic suspension infiltration steps. The fibrous preform may be infiltrated by the ceramic suspension and/or partially densified as many times as desired.

With reference to FIG. 6, a method 400 for treating a preform is shown, in accordance with various embodiments. Method 400 is similar to method 200 of FIG. 4 in that method 400 may begin with fabricating a preform (Step 402) and heat treating the preform (Step 404), and end with densifying the preform using CVI (Step 412) and heat treating the densified fibrous preform (Step 414). Infiltrating the preform with the ceramic suspension (Step 410) may be similar to the infiltration step of method 200 of FIG. 4 (i.e., Step 206 of FIG. 4) but applied at different times. Infiltrating the preform with a ceramic suspension (Step 410) may follow after the preform is partially densified using CVI (Step 406) and heat treated (step 408). In various embodiments, a heat treatment, similar to Step 209 of FIG. 4, may be performed after the ceramic suspension infiltration (Step 410) and prior to the CVI densification (i.e., prior to Step 412) to begin the ceramic transformation reaction (e.g., the carbo-thermal reduction of the yttrium oxides and zirconium oxides or the borothermal reaction).

In various embodiments, the heat treatment of Step 408, which is performed after the partial densification (Step 406), may comprise heat treating the partially densified fibrous preform at a temperature of 1850° C. (3362° F.) or greater. In various embodiments, the heat treatment of Step 408 may comprise heat treating the partially densified fibrous preform at a temperature of 2000° C. (3992° F.) or greater. In various embodiments, the heat treatment of Step 408 may comprise heat treating the partially densified fibrous preform at a temperature of between 2050° C. and 2150° C. (i.e., between 3722° F. and 3902° F.). In various embodiments, the heat treatment of Step 408 may be performed after infiltrating the preform with the ceramic suspension (Step 410) and prior to densifying the preform using CVI (Step 412).

The increased fiber volume generated by compressing fibrous preforms 10 tends to increase a rejected take-off (RTO) friction coefficient and improve wear rate. However, increased the increased friction coefficient tends to increase a vibration profile. High temperature heat treatment, tends to improve RTO performance and vibration profile, but higher heat treatment temperatures, for example, temperatures above 1600° C. (2912° F.) tend to increases wear rate (i.e. brakes wear faster). However, the increased fiber volume in combination with the increased heat treatment temperatures and incorporated ceramic particles tend to create a synergistic effect, exhibiting an increased friction coefficient at RTO with low vibration and without the increased wear rate that has historically been associated with increased heat treatment temperatures. In various embodiments, the temperature of the heat treatment applied prior to any densification (e.g., Steps 204, 304, 404 of FIGS. 4, 5, and 6, respectively) and the temperature of the heat treatment applied after densification of the fibrous preform (e.g., steps 212, 314, 414 of FIGS. 4, 5, and 6, respectively) are selected such that a hardness of the carbon fibers is similar to a hardness of the carbon matrix. The similar hardness of the fibers and matrix may allow the C/C composite to exhibit desirable wear properties.

The desirable friction coefficient at RTO may reduce an overall weight of brake systems incorporating disks comprised of the disclosed C/C composite as the brake system may be formed with four rotors, as opposed to five rotors of current brake systems. The improved wear rate may decrease cost as product life may be increased and maintenance or replacement is decreased. Further, brake disks comprised of high fiber volume C/C composite that include ceramic compound and have been heat treated at increased temperatures may be suitable for use in solid disks which tend to decrease costs and increase passenger comfort by decreasing vibration.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure.

The scope of the disclosure is accordingly to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. All ranges and ratio limits disclosed herein may be combined.

Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

The steps recited in any of the method or process descriptions may be executed in any order and are not necessarily limited to the order presented. Furthermore, any reference to singular includes plural embodiments, and any reference to more than one component or step may include a singular embodiment or step. Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

Any reference to attached, fixed, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts or areas but not necessarily to denote the same or different materials. In some cases, reference coordinates may be specific to each figure.

Systems, methods and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a carbon-carbon composite part, comprising:
   fabricating a carbonized fibrous preform comprising a fiber volume ratio of 25% or greater, wherein the carbonized fibrous preform includes carbon fibers comprised of at least 99% carbon;
   performing a first heat treatment on the carbonized fibrous preform at a first temperature;
   infiltrating the carbonized fibrous preform with a first ceramic suspension after the first heat treatment, the first ceramic suspension comprising at least one of yttrium oxide and zirconium oxide, titanium dioxide and boron, zirconium dioxide and boron, or yttrium stabilized zirconium dioxide and boron;
   performing a second heat treatment on the carbonized fibrous preform at a temperature of 1200° C. or greater after the infiltrating the carbonized fibrous preform with the first ceramic suspension, wherein the second heat treatment forms a ceramic compound comprising at least one of yttrium carbide and zirconium carbide, titanium diboride, zirconium diboride, or yttrium boride;
   densifying the carbonized fibrous preform by chemical vapor infiltration (CVI) after the second heat treatment to form a densified fibrous preform; and
   performing a third heat treatment on the densified fibrous preform at a temperature of 1600° C. or greater after the densifying the carbonized fibrous preform.

2. The method of claim 1, wherein forming the carbonized fibrous preform comprises:
   disposing a weight over a fibrous preform; and
   carbonizing the fibrous preform.

3. The method of claim 1, further comprising partially densifying the carbonized fibrous preform prior to infiltrating the carbonized fibrous preform with the first ceramic suspension to form a partially densified fibrous preform.

4. The method of claim 3, further comprising infiltrating the carbonized fibrous preform with a second ceramic suspension prior to partially densifying the carbonized fibrous preform.

5. The method of claim 4, further comprising performing a fourth heat treatment after infiltrating the carbonized fibrous preform with the second ceramic suspension and prior to the partially densifying the carbonized fibrous preform.

6. The method of claim 1, wherein the first ceramic suspension comprises at least one of titanium dioxide and boron, zirconium dioxide and boron, or yttrium stabilized zirconium dioxide and boron, and wherein the method further comprises:
   preparing the first ceramic suspension using at least one of a boron-oxide source or an oxide source and a boron source;
   wherein the oxide source comprises at least one of zirconium dioxide, yttria stabilized zirconium dioxide, or titanium dioxide; and
   wherein the boron source comprises at least one of a boron powder, a boron carbide powder, a boron oxide powder, or boric acid.

7. The method of claim 6, further comprising adding a carbon source to the first ceramic suspension, wherein the carbon source comprises at least one of polyvinyl alcohol, polyacrylamide, hydro ethylcellulose, or an aqueous emulsion of polyester, epoxy, or phenolic.

8. The method of claim 1, wherein the first temperature is greater than 2200° C.

9. The method of claim 1, wherein the carbon-carbon composite part comprises a brake disk.

10. A method of making a carbon-carbon composite, comprising:
    performing a first heat treatment on a carbonized fibrous preform at a first temperature, wherein the carbonized fibrous preform comprises a fiber volume ratio of 25% or greater, and wherein the carbonized fibrous preform includes carbon fibers comprised of at least 99% carbon;
    performing a first densification of the carbonized fibrous preform using chemical vapor infiltration (CVI);

infiltrating the carbonized fibrous preform with a first ceramic suspension after the first densification;

performing a second heat treatment on the carbonized fibrous preform after the infiltrating the carbonized fibrous preform with the first ceramic suspension;

performing a second densification of the carbonized fibrous preform using CVI after the second heat treatment to form a densified fibrous preform; and performing a third heat treatment on the densified fibrous preform at a second temperature of 1600° C. or greater.

11. The method of claim 10, further comprising performing a fourth heat treatment on the carbonized fibrous preform at a temperature of 1850° C. or greater after performing the first densification of the carbonized fibrous preform and prior to infiltrating the carbonized fibrous preform with the first ceramic suspension.

12. The method of claim 10, wherein the first temperature is greater than 2200° C.

13. The method of claim 12, further comprising:
preparing the first ceramic suspension using at least one of a boron-oxide source or an oxide source and a boron source;

wherein the oxide source comprises at least one of zirconium dioxide, yttria stabilized zirconium dioxide, titanium dioxide, or $Y_2O_3$;

wherein the boron source comprises at least one of a boron powder, a boron carbide powder, a boron oxide powder, or a boric acid, the boron powder comprising a size less than 2 micrometers; and wherein the second heat treatment forms borides in the carbon-carbon composite.

14. The method of claim 12, further comprising preparing the first ceramic suspension using yttrium oxides and zirconium oxides, wherein the second heat treatment forms at least one of zirconium oxycarbide or zirconium carbide and at least one of yttrium oxycarbide or yttrium carbide in the carbon-carbon composite.

15. The method of claim 14, wherein the fiber volume ratio of the carbonized fibrous preform is between 25% and 40%.

16. The method of claim 10, wherein the second temperature is between 1850° C. and 2100° C., and the first temperature is between 2350° C. and 2450° C.

17. The method of claim 10, further comprising:
infiltrating the carbonized fibrous preform with a second ceramic suspension; and performing a fourth heat treatment on the carbonized fibrous preform after infiltrating the carbonized fibrous preform with the second ceramic suspension and prior to the performing the first densification of the carbonized fibrous preform.

18. A method of making a carbon-carbon composite brake disk, comprising:
heat treating a carbonized fibrous preform at a temperature of 2200° C. or greater, wherein the carbonized fibrous preform comprises a fiber volume ratio of 25% or greater;

infiltrating the carbonized fibrous preform with a ceramic suspension;

heat treating the carbonized fibrous preform at a temperature of 1200° C. or greater to form a ceramic compound after infiltrating the carbonized fibrous preform with the ceramic suspension;

performing a first densification of the carbonized fibrous preform using chemical vapor infiltration (CVI) to form a densified fibrous preform; and heat treating the densified fibrous preform at a temperature of 1600° C. or greater.

19. The method of claim 18, further comprising performing a second densification of the carbonized fibrous preform prior to infiltrating the carbonized fibrous preform with the ceramic suspension.

20. The method of claim 19, further comprising heat treating the carbonized fibrous preform at a temperature of 1850° C. or greater after the second densification and prior to infiltrating the carbonized fibrous preform with the ceramic suspension.

* * * * *